US006870491B2

(12) United States Patent
Thaly

(10) Patent No.: US 6,870,491 B2
(45) Date of Patent: Mar. 22, 2005

(54) DATA DECOMPRESSION TECHNIQUE FOR IMAGE PROCESSING

(75) Inventor: Amogh D. Thaly, Caranzalem (IN)

(73) Assignee: Sasken Communication Technologies Limited, Bangalore (IN)

( * ) Notice: Subject to any disclaimer, the term of this patent is extended or adjusted under 35 U.S.C. 154(b) by 0 days.

(21) Appl. No.: 10/467,437

(22) PCT Filed: Sep. 13, 2001

(86) PCT No.: PCT/IB01/01672

§ 371 (c)(1),
(2), (4) Date: Nov. 28, 2003

(87) PCT Pub. No.: WO02/063867

PCT Pub. Date: Aug. 15, 2002

(65) Prior Publication Data

US 2004/0075597 A1 Apr. 22, 2004

Related U.S. Application Data

(60) Provisional application No. 60/266,698, filed on Feb. 6, 2001.

(51) Int. Cl.[7] .............................................. H03M 7/00
(52) U.S. Cl. ......................... 341/50; 341/106; 341/107
(58) Field of Search ........................ 341/50, 107, 106, 341/100, 51, 61, 60, 63; 382/232, 233, 234, 247, 235, 304

(56) References Cited

U.S. PATENT DOCUMENTS

| 4,891,643 | A | * | 1/1990 | Mitchell et al. | ............. 341/107 |
| 5,668,737 | A | * | 9/1997 | Iler | ............................... 712/1 |
| 5,764,801 | A | * | 6/1998 | Munemasa et al. | ......... 382/234 |
| 6,091,854 | A | * | 7/2000 | Slattery et al. | ............. 382/232 |
| 6,148,111 | A | * | 11/2000 | Creusere | ..................... 382/240 |
| 6,351,569 | B1 | * | 2/2002 | Kimura et al. | .............. 382/247 |

FOREIGN PATENT DOCUMENTS

| GB | 2285374 | 7/1995 | ............ H03M/7/40 |
| JP | 01-082874 | 7/1989 | |

OTHER PUBLICATIONS

"ITU–T Recommendation T.82", *International Telecommunication Union*, (Mar. 1993), 1–71.
Tarui, M, et al., "High–Speed Implementation of JBIG Arithmetic Coder", *Proceedings of IEE Tencon'99, Aol 2 of 2*, (Sep. 15, 1999), 1291–1294.

* cited by examiner

Primary Examiner—Brian Young
Assistant Examiner—John B Nguyen
(74) Attorney, Agent, or Firm—Schwegman, Lundberg, Woessner & Kluth, P.A.

(57) ABSTRACT

The present invention provides a fast data converter for decoding compressed image data. This is accomplished by using a series of parallel and serial computational steps to decompress the compressed image data and reduce processing cycle time. The high speed decoder receives the input data stream including first and second parameters having initial values and which are representative of properties of the data stream, and a third parameter having a value which is representative of a decoding property of the decoder. The decoder then decodes the initial values of the first, second, and third parameters to determine updated values of the first and second parameters by using a combination of parallel and serial processing steps. The decoder then compares the determined value of the reference parameter with the computed first subtraction value and outputs updated values for the first and second parameters based on the outcome of the comparison by the comparator to reduce decoding cycle time.

32 Claims, 5 Drawing Sheets

DATA DECOMPRESSION TECHNIQUE FOR IMAGE PROCESSING

This application claims the benefit of Provisional application Ser. No. 60/266,698, filed Feb. 6, 2001.

FIELD OF THE INVENTION

This invention generally relates to a high-speed data processor and decoding technique, and more particularly to a high-speed data processor and decoding technique for image processing devices such as printing, faxing, and/or scanning devices.

BACKGROUND

Data compression is a term generally used to refer to a technique for reducing the number of digits (or bits) required to represent image data. Image data can be compressed using a known data compression technique, such as arithmetic or Huffman encoding, and a standard data compression format, such as international Telecommunication Union (ITU) Group 3/4, Joint Bi-level Image experts Group (JBIG), or Joint Photographic Experts Group (JPEG). Data decompression, achieves the reverse, extracting the full image information from the compressed image data.

Arithmetic encoding is a well-known and efficient process for entropy encoding an input stream of image data. Entropy encoding is a process of compressing data (by assigning certain optimal numerical values called codes) based on a value of the probability of the image data. Arithmetic encoding is used in many data compression applications including the International Standard Organization (ISO) for JPEG and JBIG. Arithmetic decoding achieves the reverse of what the arithmetic encoding achieves by entropy decoding the encoded data stream and generating the image data from it. Entropy decoding is the reverse process of entropy encoding, wherein the data is retrieved from the assigned codes.

The maximum speed of the overall decoding process depends on the ability of the decoder to perform these (and other) calculations and decisions quickly. In existing entropy decoders however, the computations require a series of sequential processing steps which include a subtraction operation, a subsequent comparison operation that depends on the results of the previous subtraction operation, and another subsequent subtraction operation which again depends on the results of the previous comparison operation. These types of sequential operations that depend on the result of a previous operation impose a significant constraint on the decoding operation and considerably slows down the speed of the decoding process.

Therefore there is a need in the art for a faster decoding technique that does not have the dependencies inherent in the above-described sequential process to increase the speed of the decoding process.

SUMMARY OF THE INVENTION

The present invention provides a high-speed decoder of compressed image data. In one example embodiment, this is accomplished by receiving an input data stream including first and second parameters having initial values and which are representative of properties of the data stream, and a third parameter having a value which is representative of a decoding property of a decoder. The decoder then determines a value for a reference parameter as a function of the third parameter using a lookup table. In parallel, the analyzer computes first and second subtraction values, using initial values of the first and second parameters. The decoder further computes an updated value for the second parameter by adding the computed second subtraction value to the determined value of the reference parameter. In parallel, the decoder further computes an updated value for the first parameter by using the initial value of the first parameter and the determined value for the reference parameter. In addition, the decoder compares the determined value of the reference parameter with the computed first subtraction value and outputs updated values for the first and second parameters based on the outcome of the comparison by the comparator.

Another aspect of the present invention is a method for decoding compressed image data. The method is performed by receiving an input data stream including first and second parameters having initial values and which are representative of properties of the data stream, and a third parameter having a value which is representative of a decoding property of a decoder. A value for a reference parameter as a function of the third parameter is determined using the initial value of the third parameter and lookup table. In parallel, first and second subtraction values are computed, using initial values of the first and second parameters. Further, an updated value for the second parameter is computed by adding the computed second subtraction value to the determined value of the reference parameter. In parallel, an updated value for the first parameter is computed using the initial value of the first parameter and the determined value for the reference parameter. The determined value of the reference parameter is compared with the computed first subtraction value, and updated values for the first and second parameters based on the outcome of the comparison is outputted to reduce decoding cycle time.

Another aspect of the present invention is a computer readable medium having computer-executable instructions for improved data-rate detection in a communication system including multiple transport channels supporting variable data-rate transmissions. According to the method, the process includes receiving an input data stream including first and second parameters having initial values and which are representative of properties of the data stream, and a third parameter having a value which is representative of a decoding property of a decoder. A value for a reference parameter as a function of the third parameter is determined using the initial value of the third parameter and a lookup table. In parallel, first and second subtraction values are computed, using initial values of the first and second parameters. Further, an updated value for the second parameter is computed by adding the computed second subtraction value with the determined value of the reference parameter. In parallel, an updated value for the first parameter is computed using initial value of the first parameter and the determined value for the reference parameter. The determined value of the reference parameter is compared with the computed first subtraction value, and updated values for the first and second parameters based on the outcome of the comparison is outputted to reduce decoding cycle time.

Another aspect of the present invention is a computer system for detecting data-rate detection signals received from a transmitter capable of transmitting data at a plurality of data rates. The computer system comprises a storage device, an output device, and a processor programmed to repeatedly perform a method. The method is performed by receiving an input data stream including first and second parameters having initial values and which are representative of properties of the data stream, and a third parameter having a value which is representative of a decoding property of a decoder. A value for a reference parameter as a function of the third parameter is determined using the initial value of the third parameter and lookup table. In parallel, first and second subtraction values, using initial values of the first and second parameters are computed. Further, an updated value for the second parameter is computed by adding the computed second subtraction value with the determined value of the reference parameter. In parallel, an updated value for the first parameter is computed using the initial value of the first parameter and the determined value for the reference parameter. The determined value of the reference parameter is compared with the computed first subtraction value, and updated values for the first and second parameters based on the outcome of the comparison is outputted to reduce decoding cycle time.

Other aspects of the invention will be apparent on reading the following detailed description of the invention and viewing the drawings that form a part thereof.

DETAILED DESCRIPTION

The present invention provides an improved receiver by increasing the efficiency and reliability of data-rate detection in a radio communication system including multiple transport channels supporting variable data-rate transmissions. This is accomplished by providing computationally efficient and more accurate detection techniques.

Figure 1:
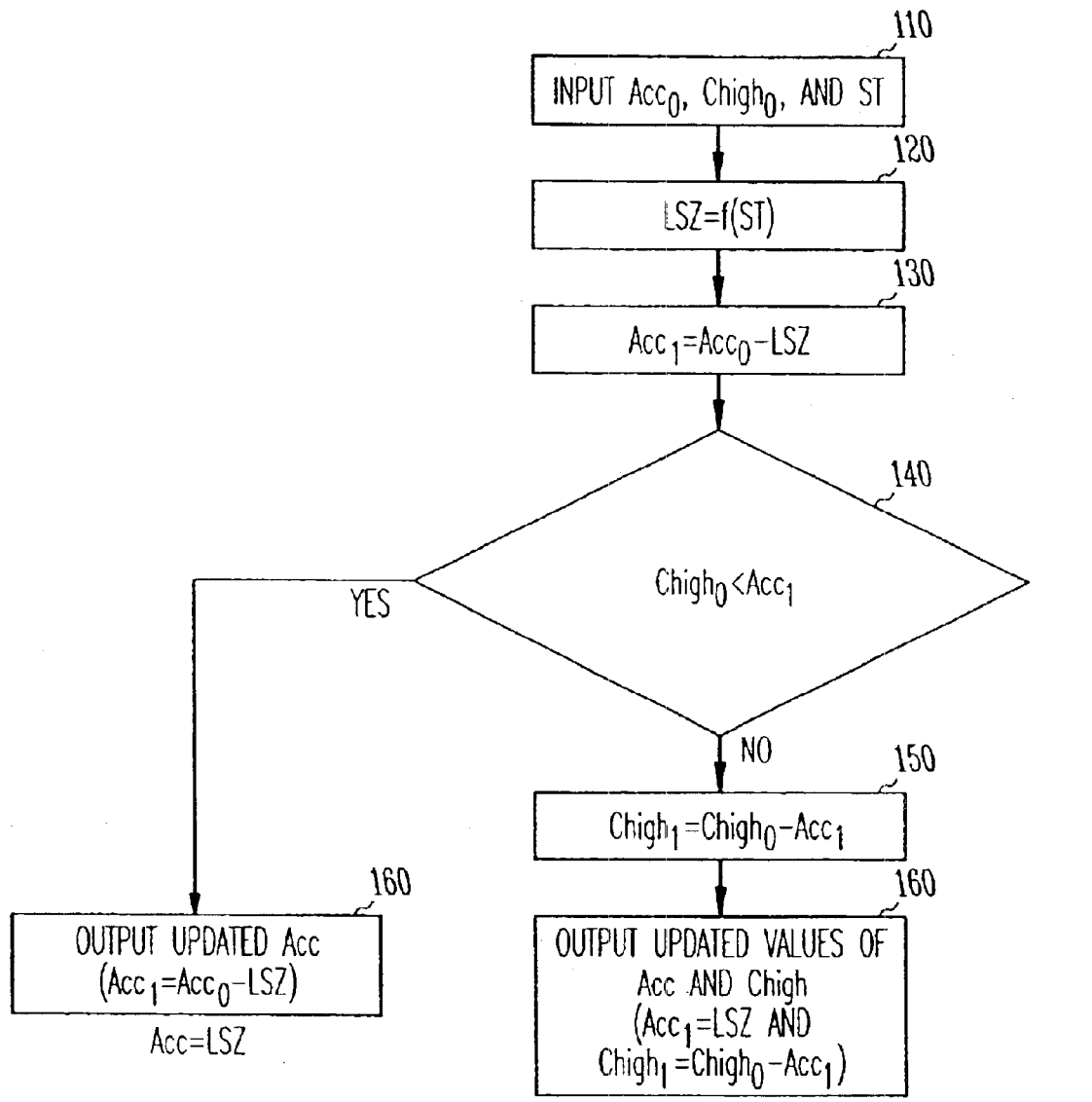
FIG. 1 is a flow chart illustrating a prior-art data decompression process.

FIG. 1 is a flowchart illustrating a prior-art data decompression process 100 which implements an arithmetic decoding technique such as entropy decoding (see document T.82 of the Telecommunications Standardization Sector of the International Telecommunication Union (ITU-T.82)). During the decoding process, the decoding is performed sequentially as shown in FIG. 1 on an input stream of compressed image data. Three input parameters Acc, Chigh, and ST having initial values Acc0, Chigh0, and ST enter at step 110. The first parameter Acc represents a size of an interval between 0 and 1, the second parameter Chigh represents the bottom or base of the interval, and the third parameter ST represents the index value used to generate symbol probability estimates as specified in the ITU-T.82 standard. The third parameter ST is used to define probability estimates and is also a general representation of the image data, wherein its value is obtained and updated based on the image data and tables defined by the ITU-T.82 (JBIG) standard.

Step 120 includes obtaining a reference parameter LSZ based on a function of input parameter ST by addressing a lookup table. Step 130 includes updating the initial value of Acc0 to a new value Acc1 by subtracting the obtained reference parameter LSZ from the initial value Acc0. It can be seen that the subtraction operation depends upon the value assigned to the reference parameter LSZ and cannot be performed until the reference parameter LSZ is obtained. In general there is an inherent delay in obtaining the value of the third parameter ST from a memory location, which in turn further delays obtaining the value of LSZ.

Step 140 includes comparing the initial value of Chigh0 with the updated new value Acc1. Again, the comparison at step 140 depends on the updated new value Acc1 and cannot be performed until the previous subtraction operation shown in Step 130 is completed. If Chigh0 is greater than or equal to the value Acc1, then the initial value Chigh0 is updated to a new value Chigh1, by subtracting the initial value Chigh0 from the new value Acc1 at step 150. Then at step 160 the process includes outputting with the new values Acc1 and Chigh1 for parameters Acc and Chigh, respectively. If however Chigh0 is less than the new value Acc1 then the process includes outputting the new value Acc1 for parameter Acc and the initial value Chigh0 for parameter Chigh. Once again, the downstream operations at steps 150 and 160 depend upon the outcome of the comparison at step 140.

Due to the dependencies in the sequential steps described above, there is delay in obtaining ST, obtaining LSZ, computing Acc1, comparing Chigh0 with Acc1, and lastly in computing Chigh1. Therefore there are around five sequential delays in the above described prior-art process. Generally, these delays increase in each of the steps 120, 130, 140, and 150 due to the dependencies between each sequential step in the prior art process. As such, it is difficult to improve the processing speed (or cycle time) of the decoder in software or hardware implementations of this process.

Figure 2:
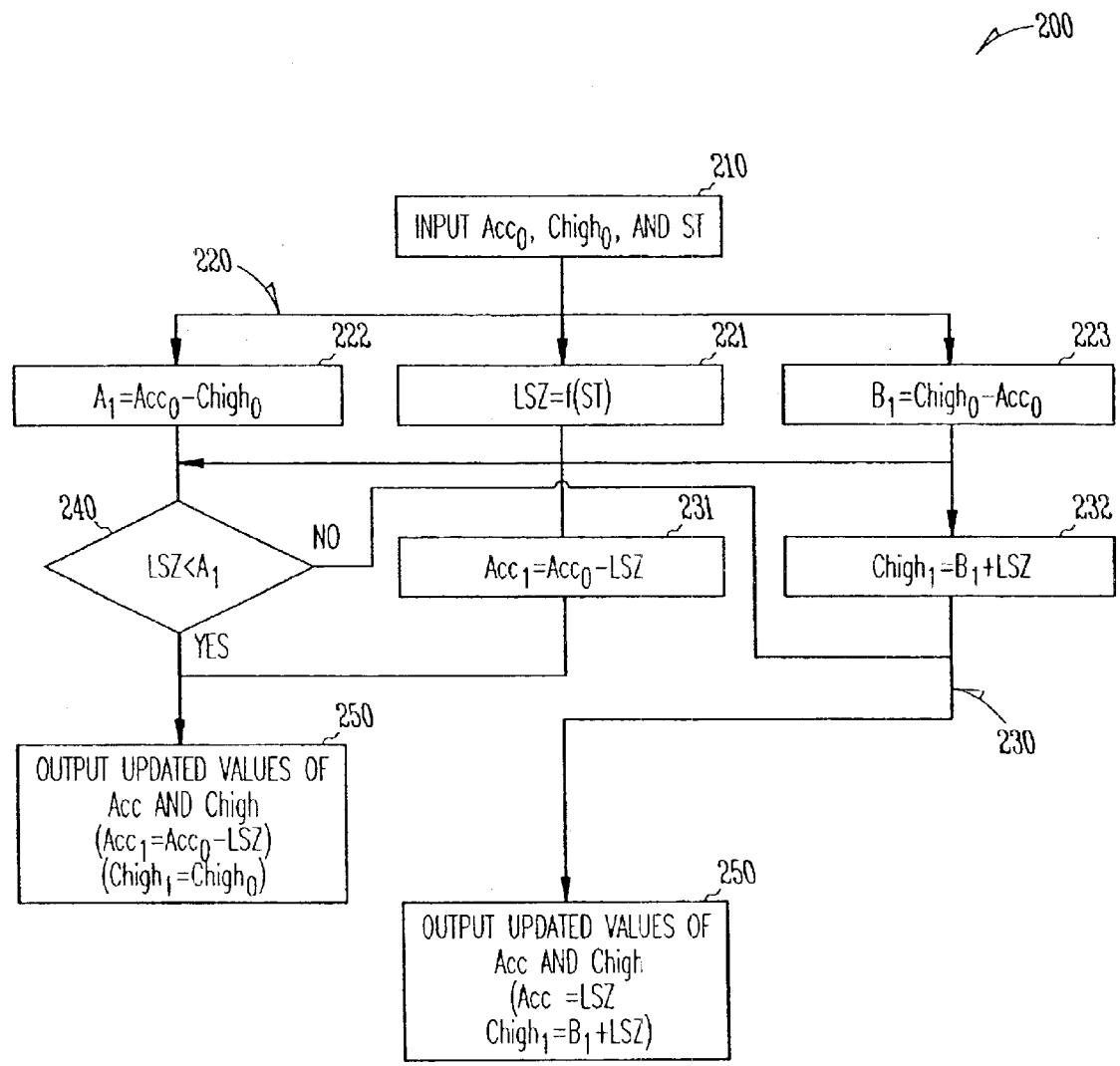
FIG. 2 is a flow chart illustrating a data decompression process according to the principles of the invention.

FIG. 2 is a flowchart illustrating a data decompression process 200 which implements an arithmetic decoding technique such as entropy decoding (see document T.82 of the Telecommunications Standardization Sector of the International Telecommunication Union (ITU-T.82)) according to the teachings of the present invention. During the decoding process, the decoding is performed in parallel and serial steps as shown in FIG. 2 on an input stream of compressed image data to reduce decoding cycle time. Three input parameters Acc, Chigh, and ST having initial values Acc0, Chigh0, and ST enter at step 210. The first parameter Acc represents a size of an interval between 0 and 1, the second parameter Chigh represents the bottom or base of the interval, and the third parameter ST represents the index value used to generate symbol probability estimates as specified in the ITU-T.82 standard. The third parameter ST is used to define probability estimates and is also a general representation of the image data wherein its value is obtained and updated based on the image data and tables defined by the ITU-T.82 (JBIG) standard. In another embodiment, the initial value for the first parameter represents the size of an interval. In some embodiments, the initial value for the second parameter represents the base of the interval. In some embodiments, the initial value for the third parameter represents an index value used to generate symbol probability estimates as specified in the ITU-T.82 standard.

Step 220 generally includes parallel computing steps 221, 222, and 223 obtaining a value for a reference parameter LSZ based on a function of input parameter $f(ST)$ by addressing a lookup table, and computing first and second subtraction values A1 and B1, respectively using initial values of the first and second parameters as follows:

$A1 = Acc0 - Chigh0$ $B1 = Chigh0 - Acc0$

Step 230 generally includes parallel computing steps 231, and 232 to update the value of the second parameter by adding the computed second subtraction value B1 to the determined value of the reference parameter LSZ, and to further update the value of the first parameter using initial value of the first parameter Acc0 and the determined value for the reference parameter LSZ, respectively.

In other embodiments, the first subtraction value A1 is computed by subtracting the value of the second parameter from the first parameter, and the second subtraction value B1 is computed by subtracting the value of the fist parameter from the second parameter. In other embodiments, the updated value for the first parameter Acc1 is computed by using the initial value of the first parameter and the determined value for the reference parameter as follows:

$Acc1 = Acc0 - LSZ$

Step 240 includes comparing the determined value of the reference parameter LSZ with the computed first subtraction value A1. In some embodiments, Step 240 is performed in parallel with Steps 231 and 232. Step 250 includes outputting the updated values for the first and second parameters based on the outcome of the comparison.

In some embodiments, step 240 includes outputting the updated value of the first parameter and the initial value of the second parameter when the determined value of the reference parameter is less than the computed first subtraction value as follows.

$Acc1 = Acc0 - LSZ$ $Chigh1 = Chigh0$

Step 240 further includes outputting updated values of the first and second parameters when the determined value of the reference parameter is not less than the computed first subtraction value as follows:

$Acc1 = LSZ$ $Chigh1 = B1 + LSZ$

It can be seen that the above-described decoding process 200 includes performing steps 210–250 in parallel and serial as shown in FIG. 2 on an input stream of compressed image data. The parallel and serial steps in the decoding process 200 shown in FIG. 2 reduces the number of dependencies present in the sequential processing steps present in the prior art decoding process 100 to enhance processing time. The decoding process 200 shown in FIG. 2 reduces the approximately five sequential delays present in the prior-art process 100 shown in FIG. 1 to around 3.

Figure 3:
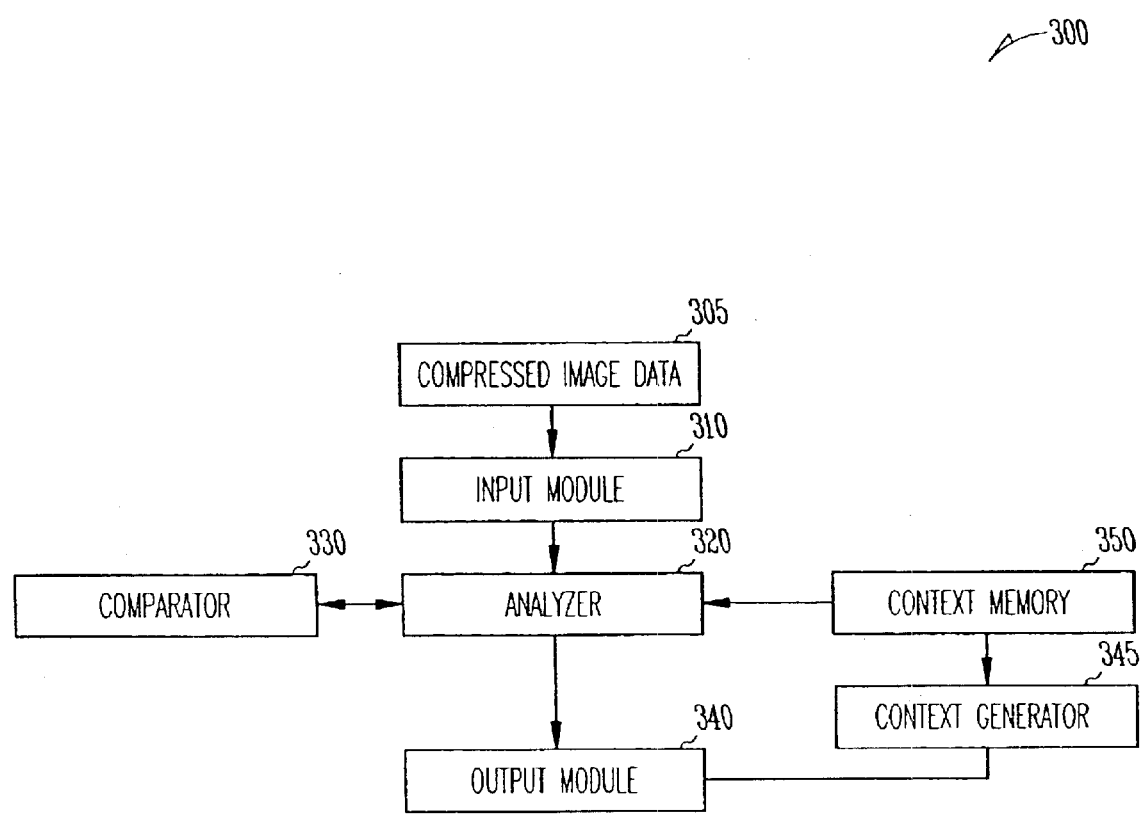
FIG. 3 is a block diagram illustrating major components of a decoder used in the data decompression process shown in FIG. 2.

FIG. 3 is a block diagram of the data converter 300 for data decompression according to the principles of the invention. Shown in FIG. 3 are input module 310, analyzer 320, comparator 330, output module 340, context generator 345, context memory 350, and compressed image data 305.

In operation, the input module 310 receives compressed image data (encoded image data) 305 in the form of an input data stream including first and second parameters having initial values which are representative of properties of the data stream, and a third parameter having a value which is representative of a decoding property of the decoder 300. In some embodiments, the initial value for the first parameter represents the size of an interval. In some embodiments, the initial value for the second parameter represents the base of the interval. In some embodiments, the initial value for the third parameter represents an index value used to generate symbol probability estimates as specified in the ITU-T.82 standard. In some embodiments, the third parameter represents the decoding state and is used to determine the reference parameter using the lookup table.

The analyzer 320 connected to the input module 310 determines a value for a reference parameter as a function of the third parameter using a lookup table. Further, in parallel, the analyzer 320 computes first and second subtraction values, using initial values of the first and second parameters. The analyzer 320 then computes an updated value for the second parameter by adding the computed second subtraction value to the determined value of the reference parameter. Further, the analyzer 320 computes in parallel an updated value for the first parameter by using the initial value of the first parameter and the determined value for the reference parameter. In some embodiments, the analyzer 320 computes the first subtraction value by subtracting the second parameter from the first parameter, computes the second subtraction value by subtracting the first parameter from the second parameter, and further computes an updated value for the first parameter by using the initial value of the first parameter and the determined value for the reference parameter.

The comparator 330 connected to the analyzer 320 compares the determined value of the reference parameter with the computed first subtraction value, and the output module 340 connected to the analyzer 320 outputs updated values of the first and second parameters based on the outcome of the comparison by the comparator to reduce the processing time and the decoding cycle time. In some embodiments, the output module 340 outputs the updated value for the first parameter with a value obtained by subtracting the determined value for the reference parameter from the initial value of the first parameter and the initial value for the second parameter when the determined value of the reference parameter is less than the computed first subtraction value. In further embodiments, the output module 340 updates the value of the first parameter with the determined reference value of the reference parameter and the second parameter by adding the second subtraction value to the determined reference parameter when the determined value of reference parameter is not less than the first subtraction value.

In some embodiments, the output module 340 outputs the updated values for the first and second parameters when the determined value of the reference parameter is greater than the computed first subtraction value. In further embodiments, the output module 340 updates the value of the first parameter by using the determined value of the reference parameter, and further updates the value of the second parameter with a value obtained by adding the first subtraction value to the determined value of the reference parameter.

The analyzer 320 combines the above-described parallel and serial computation sequences to reduce processing cycle time. In some embodiments, the data converter 300 uses the context memory 350 to store reference parameters in the lookup table. In a further embodiment, the data converter includes a context generator 345 coupled to the context memory 350 and the output module 340. The context generator 345 is a logic used in the generation of addresses for the context memory 350, which in turn generates the input parameter ST. In another embodiment, the context generator 345 is shared between an encoder and a decoder in generation of addresses used to access the context memory 350.

Figure 4:
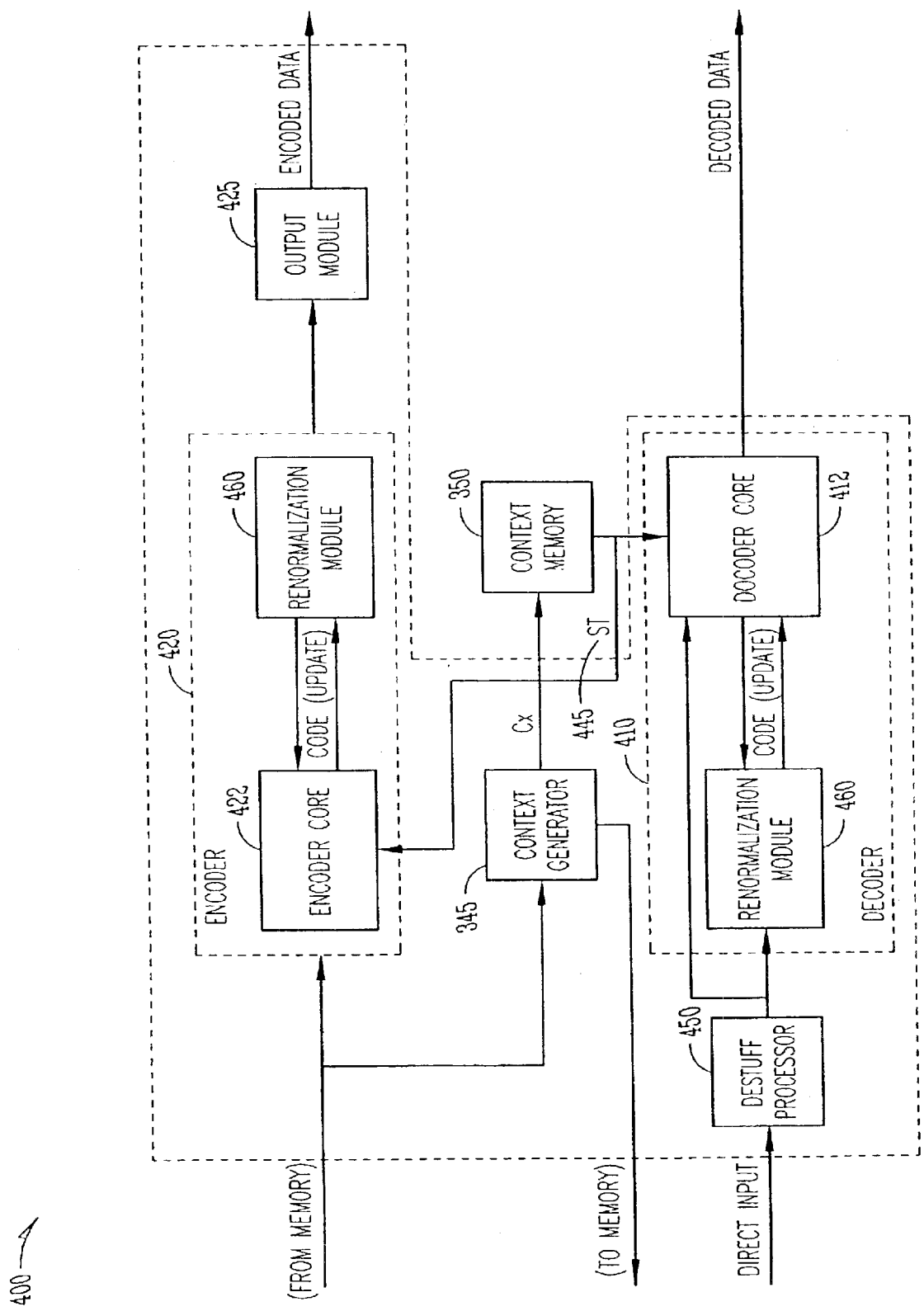
FIG. 4 is a block diagram illustrating major components of a data converter incorporating the decoder of the present invention.

FIG. 4 is a block diagram illustrating major components of a data converter 400 incorporating the decoder 410 of the present invention and an encoder 420 on an integrated circuit device. As shown in FIG. 4, the data converter includes encoder 420, decoder 410, and a logic such as the context generator 345 and the context memory 350 related to the generation and storing of the input parameter ST 445 is shared between the decoder 410 and the encoder 420. This sharing of the context generator 345 and the context memory 350 results in reduction of the size of the device. The encoder 420 includes an encoder core 422 and a renormalization module 460. Shown in FIG. 4 is inputting of the image data into the encoder core 422 (coming from context generator 345). Compressed (encoded) data is output through an output module 425 coupled to the encoder 420. As shown in FIG. 4, the data converter 400 includes a destuff processor 450 which receives the external input encoded data from the encoder 420 and feeds it to the decoder 410. The decoder 410 includes decoder core 412 and renormalization module 460. The decoder core 412 receives the encoded data from the destuff processor through the renormalization module 460, performs decompression of the encoded data and outputs the decompressed (decoded) data for use in image processing devices such as printers, faxes, scanning and/or other such devices through context generator 345. As shown in FIG. 4, the decoder 410 shares the context memory 350 in obtaining a value for the reference parameter as a function of the third parameter using the lookup table. The renormalization modules 460 shown in FIG. 4 are a combinatorial logic performing an internal parametric information update as specified by the ITU-T.82 JBIG standard renormalization routine for the decoder 410 and the encoder 420.

The method 200 shown in FIG. 2 may be implemented in input module 310, analyzer 320, comparator 330, output module 340, context generator 345 and context memory 350 as shown in FIG. 2. Various aspects of the present invention are implemented in software, which is executed in the environment shown in FIG. 5 or any other suitable computing environment. The present invention is operable in a number of other general purpose or special purpose computing environments. Some computing environments are personal computers, general-purpose computers, server computers, hand held devices, laptop devices, multiprocessors, microprocessors, set top boxes, programmable consumer electronics, network PCs, minicomputers, mainframe computers, distributed computing environments and the like to execute the code, which is stored on a computer readable medium. The present invention may be implemented in part or in whole as computer-executable instructions, such as program modules that are executed by a computer. Generally, program modules include routines, programs, objects, components, data structures and the like to perform particular tasks or to implement particular abstract data types. In a distributed computing environment, program modules may be located in local or remote storage devices.

Figure 5:
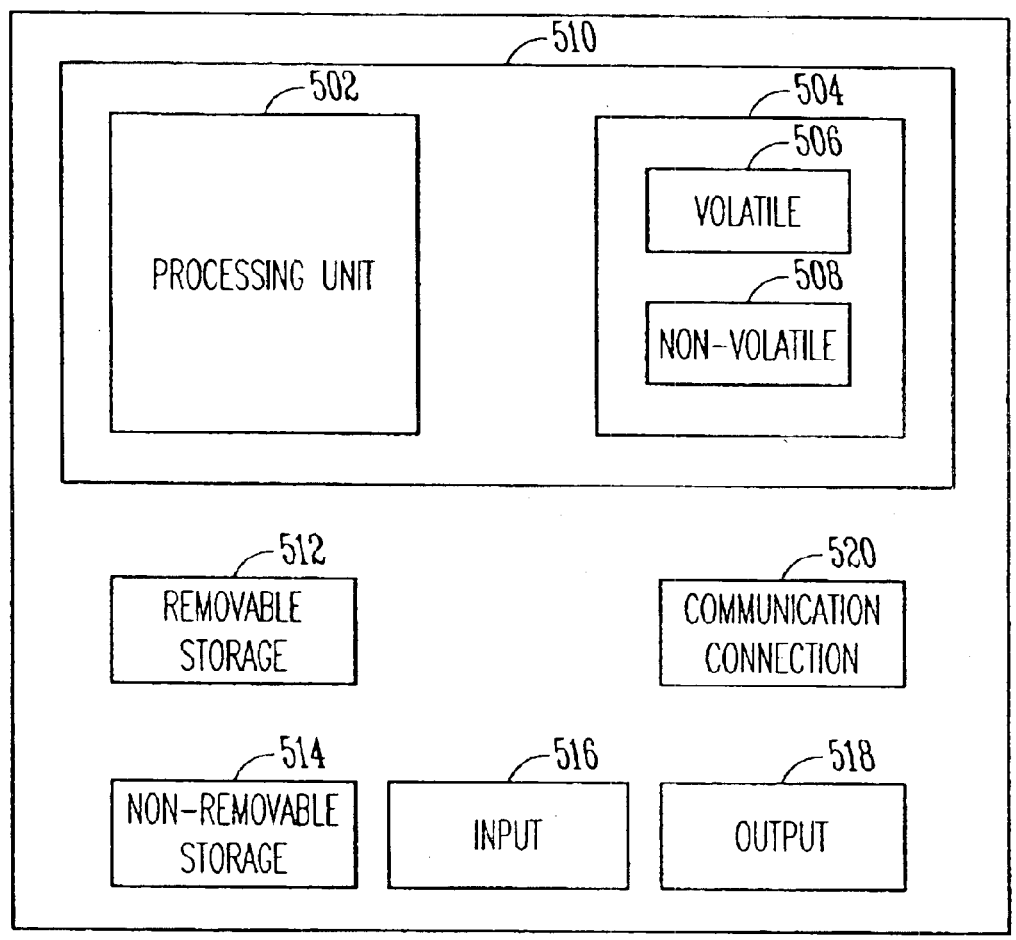
FIG. 5 is a block diagram example of a suitable computing system environment for implementing embodiments of the present invention, such as those shown in FIGS. 2, 3 and 4.

FIG. 5 shows an example of a suitable computing system environment 500 for implementing embodiments of the present invention, such as those shown in FIGS. 2, 3 and 4. Various aspects of the present invention are implemented in software, which may be run in the environment shown in FIG. 5 or any other suitable computing environment. The present invention is operable in a number of other general purpose or special purpose computing environments. Some computing environments are personal computers, server computers, hand-held devices, laptop devices, multiprocessors, microprocessors, set top boxes, programmable consumer electronics, network PCs, minicomputers, mainframe computers, distributed computing environments, and the like. The present invention may be implemented in part or in whole as computer-executable instructions, such as program modules that are executed by a computer. Generally, program modules include routines, programs, objects, components, data structures and the like to perform particular tasks or to implement particular abstract data types. In a distributed computing environment, program modules may be located in local or remote storage devices.

FIG. 5 shows a general computing device in the form of a computer 510, which may include a processing unit 502, memory 504, removable storage 512, and non-removable storage 514. The memory 504 may include volatile 506 and non-volatile memory 508. Computer 510 may include—or have access to a computing environment that includes—a variety of computer-readable media, such as volatile 506 and non-volatile memory 508, removable 512 and non-removable storage 514. Computer-readable media also include carrier waves, which are used to transmit executable code between different devices by means of any type of network. Computer storage includes RAM, ROM, EPROM & EEPROM, flash memory or other memory technologies, CD ROM, Digital Versatile Disks (DVD) or other optical disk storage, magnetic cassettes, magnetic tape, magnetic disk storage or other magnetic storage devices, or any other medium capable of storing computer-readable instructions. Computer 510 may include or have access to a computing environment that includes input 516, output 518, and a communication connection 520. The computer may operate in a networked environment using a communication connection to connect to one or more remote computers. The remote computer may include a personal computer, server, router, network PC, a peer device or other common network node, or the like. The communication connection may include a Local Area Network (LAN), a Wide Area Network (WAN) or other networks.

CONCLUSION

The above-described invention provides a fast decoding technique that does not have the dependencies inherent in the prior-art sequential processes in order to increase the speed of the decoding process. Although, the above-described invention is for a decoder, the principles of the invention can be incorporated in to an encoder to enhance the data compression process in high-resolution image processing.

The above description is intended to be illustrative, and not restrictive. Many other embodiments will be apparent to those skilled in the art. The scope of the invention should therefore be determined by the appended claims, along with the full scope of equivalents to which such claims are entitled.

What is claimed is:

1. A method of decoding compressed image data, comprising:

receiving compressed image data in the farm of an input data stream including first and second parameters having initial values and which are representative of properties of the data stream, and a third parameter having a value which is representative of a decoding property of a decoder; and arithmetic decoding of the received compressed image data, wherein the arithmetic decoding of the received data includes a combination of parallel and serial processing steps to reduce processing time wherein decoding the received compressed image data further comprises:

determining a value for a reference parameter as a function of the third parameter using a lookup table, in parallel, computing first and second subtraction values using initial values of the first and second parameters;

computing an updated value for the second parameter by adding the computed second subtraction value to the determined value of the reference parameter, in parallel, computing an updated value for the first parameter using the initial value of the first parameter and the determined value for the reference parameter;

comparing the determined value of the reference parameter with the computed first subtraction value; and outputting the undated values for the first and second parameters based on the outcome of the comparison.

2. The method of claim 1, wherein computing the first and second subtraction values, and further computing an updated value for the first parameter further comprises:

computing a first subtraction value by subtracting the second parameter from the first parameter;

computing a second subtraction value by subtracting the first parameter from the second parameter; and computing an updated value for the first parameter by using the initial value of the first parameter and the determined value for the reference parameter.

3. The method of claim 2, wherein outputting the updated values of the first and second parameters further comprises:

if the determined value of the reference parameter is less than the computed first subtraction value, then outputting the updated value for the first parameter and the initial value for the second parameter; and if the determined value of the reference parameter is not less than the computed first subtraction value, then outputting the updated values for the first and second parameters.

4. The method of claim 1, wherein combination of parallel and serial processing steps provides a reduced processing cycle time.

5. The method of claim 1, wherein the initial value for the first parameter represents the size of an interval.

6. The method of claim 1, wherein the initial value for the second parameter represents the base of the interval.

7. The method of claim 1, wherein the initial value for the third parameter represents an index value used to generate symbol probability estimates as specified in the ITU-T.82 standard.

8. A computer readable medium having computer-executable instructions for decoding compressed image data, comprising:

receiving an input data stream including first and second parameters having initial values which are representative of properties of the data stream, and a third parameter having a value which is representative of a decoding property of a decoder;

determining a value for a reference parameter as a function of the third parameter using a lookup table, in parallel, computing first and second subtraction values using initial values of the first and second parameters;

computing an updated value for the second parameter by adding the computed second subtraction value to the determined value of the reference parameter, in parallel, computing an updated value for the first parameter using the initial value of the first parameter and the determined value for the reference parameter;

comparing the determined value of the reference parameter with the computed first subtraction value; and outputting the updated values for the first and second parameters based on the outcome of the comparison.

9. The medium of claim 8, wherein computing the first and second subtraction values, and further computing an updated value for the first parameter comprises:

computing a first subtraction value by subtracting the second parameter from the first parameter;

computing a second subtraction value by subtracting the first parameter from the second parameter; and computing an updated value for the first parameter by using initial value of the first parameter and the determined value for the reference parameter.

10. The medium of claim 9, wherein outputting the updated values of the first and second parameters further comprises:

if the determined value of the reference parameter is less than the computed first subtraction value, then outputting the updated value for the first parameter and the initial value for the second parameter; and if the determined value of the reference parameter is not less than the computed first subtraction value, then outputting the updated values for the first and second parameters.

11. The medium of claim 9, wherein the combination of parallel and serial processing steps provides a reduced processing cycle time.

12. The medium of claim 9, wherein the initial value for the first parameter represents the size of an interval.

13. The medium of claim 9, wherein the initial value for the second parameter represents the base of the interval.

14. The medium of claim 9, wherein the initial value for the third parameter represents an index value used to generate symbol probability estimates as specified in the ITU-T.82 standard.

15. A computer system for decoding compressed image data, comprising:

a storage device;

an output device; and a processor programmed to repeatedly perform a method, comprising:

receiving an input data stream including first and second parameters having initial values and which are representative of properties of the data stream, and a third parameter having a value which is representative of a decoding property of a decoder;

determining a value for a reference parameter as a function of the third parameter using a lookup table, in parallel, computing first and second subtraction values using initial values of the first and second parameters, respectively;

computing an updated value for the second parameter by adding the computed second subtraction value to the determined value of the reference parameter, in parallel, computing an updated value for the first parameter using the initial value of the first parameter and the determined value for the reference parameter;

comparing the determined value of the reference parameter with the computed first subtraction value; and outputting the updated values for the first and second parameters based on the outcome of the comparison.

16. The system of claim 15, wherein computing the first and second subtraction values, and further computing an updated value for the first parameter comprises:

computing a first subtraction value by subtracting the second parameter from the first parameter;

computing a second subtraction value by subtracting the first parameter from the second parameter; and computing an updated value for the first parameter by using the initial value of the first parameter and the determined value for the reference parameter.

17. The system of claim 16, wherein outputting the updated values of the first and second parameters further comprises:

if the determined value of the reference parameter is less than the computed first subtraction value, then outputting the updated value for the first parameter and the initial value for the second parameter; and if the determined value of the reference parameter is not less than the computed first subtraction value, then outputting the updated values for the first and second parameters.

18. The system of claim 15, wherein combination of parallel and serial processing steps provides a reduced processing cycle time.

19. The system of claim 15, wherein the initial value for the first parameter represents the size of an interval.

20. The system of claim 15, wherein the initial value for the second parameter represents the base of the interval.

21. The system of claim 15, wherein the initial value for the third parameter represents an index value used to generate symbol probability estimates as specified in the ITU-T.82 standard.

22. A high-speed data converter for decoding compressed image data, comprising:

an input module to receive an input data stream including first and second parameters having initial values which are representative of properties of the data stream, and a third parameter having a value which is representative of a decoding property of a decoder;

an analyzer to determine a value for a reference parameter as a function of the third parameter using a lookup table, in parallel, the analyzer to compute first and second subtraction values, using initial values of the first and second parameters, wherein the analyzer further computes an updated value for the second parameter by adding the computed second subtraction value to the determined value of the reference parameter, in parallel, the analyzer to further compute an updated value for the first parameter by using the initial value of the first parameter and the determined value for the reference parameter;

a comparator to compare the determined value of the reference parameter with the computed first subtraction value; and an output module to output updated values of the first and second parameters based on the outcome of the comparison by the comparator.

23. The data converter of claim 22, wherein the analyzer computes the first subtraction value by subtracting the second parameter from the first parameter, computes the second subtraction value by subtracting the first parameter from the second parameter, and computes an updated value for the first parameter by using the initial value of the first parameter and the determined value for the reference parameter.

24. The data converter of claim 23, wherein the output module outputs an updated value for the first parameter and the initial value for the second parameter when the determined value of the reference parameter is less than the computed first subtraction value, and wherein the data converter updates value of the first parameter with a value obtained by subtracting the determined value for the reference parameter from the initial value of the first parameter.

25. The data converter of claim 24, wherein the output module outputs the updated values for the first and second parameters when the determined value of the reference parameter is not less than the computed first subtraction value, and wherein the data converter further updates the value of the first parameter by using the determined value of the reference parameter and further updates the value of the second parameter with a value obtained by adding the first subtraction value with the determined value of the reference parameter.

26. The data converter of claim 22, wherein the analyzer combines parallel and serial computation to reduce processing cycle time.

27. The data converter of claim 22, wherein the initial value for the first parameter represents the size of an interval.

28. The data converter of claim 22, wherein the initial value for the second parameter represents the base of the interval.

29. The data converter of claim 22, wherein the initial value for the third parameter represents an index value used to generate symbol probability estimates as specified in the ITU-T.82 standard.

30. The data converter of claim 22, wherein the initial value for the third parameter represents the decoding state and is used to determine the reference parameter using the lookup table.

31. The data converter of claim 22, further comprising a context memory to store reference parameters in the lookup table.

32. The data converter of claim 30, further comprising a context generator to generate addresses for the context memory.

* * * * *

UNITED STATES PATENT AND TRADEMARK OFFICE
CERTIFICATE OF CORRECTION

PATENT NO.   : 6,870,491 B2
DATED        : March 22, 2005
INVENTOR(S)  : Thaly

It is certified that error appears in the above-identified patent and that said Letters Patent is hereby corrected as shown below:

<u>Column 8,</u>
Line 59, delete "farm" and insert -- form --, therefor.

<u>Column 9,</u>
Line 16, delete "undated" and insert -- updated --, therefor.

Signed and Sealed this

Nineteenth Day of July, 2005

JON W. DUDAS
*Director of the United States Patent and Trademark Office*